US012744066B2

(12) United States Patent
Song

(10) Patent No.: US 12,744,066 B2
(45) Date of Patent: Sep. 22, 2026

(54) SEMICONDUCTOR DEVICE, SEMICONDUCTOR SYSTEM, AND OPERATING METHOD OF SEMICONDUCTOR DEVICE

(71) Applicant: SK hynix Inc., Gyeonggi-do (KR)

(72) Inventor: Choung Ki Song, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 74 days.

(21) Appl. No.: 18/668,263

(22) Filed: May 20, 2024

(65) Prior Publication Data

US 2025/0252985 A1 Aug. 7, 2025

(30) Foreign Application Priority Data

Feb. 7, 2024 (KR) ........................ 10-2024-0018654

(51) Int. Cl.
*G11C 7/22* (2006.01)
*G11C 7/10* (2006.01)

(52) U.S. Cl.
CPC .............. *G11C 7/222* (2013.01); *G11C 7/106* (2013.01); *G11C 7/1063* (2013.01)

(58) Field of Classification Search
CPC ........ G11C 7/222; G11C 7/106; G11C 7/1063
USPC ........................................................ 365/233.1
See application file for complete search history.

(56) References Cited

U.S. PATENT DOCUMENTS

2009/0019323 A1* 1/2009 Porterfield .......... G06F 13/4243 714/E11.002
2010/0325372 A1* 12/2010 Housty ............... G06F 13/4234 711/E12.001
2018/0342275 A1* 11/2018 Song .................... G11C 7/1066
2023/0032415 A1* 2/2023 Choi ................ G11C 29/50012

OTHER PUBLICATIONS

Extended European Search Report for European Patent Application No. 24218565.0 issued by the European Patent Office on May 19, 2025.

* cited by examiner

*Primary Examiner* — Amir Zarabian
*Assistant Examiner* — Daniel John King
(74) *Attorney, Agent, or Firm* — IP & T GROUP LLP

(57) ABSTRACT

A semiconductor system may include a semiconductor device, a controller configured to control the semiconductor device through an in-band interface, and a baseboard management controller configured to control the semiconductor device through a side-band interface, wherein the semiconductor device is configured to control a training operation for in-band signals that are received through the in-band interface based on side-band signals that are received through the side-band interface.

18 Claims, 5 Drawing Sheets

SEMICONDUCTOR DEVICE, SEMICONDUCTOR SYSTEM, AND OPERATING METHOD OF SEMICONDUCTOR DEVICE

CROSS-REFERENCE TO RELATED APPLICATION

This application claims priority under 35 U.S.C. § 119 to Korean Patent Application No. 10-2024-0018654 filed on Feb. 7, 2024, which is incorporated herein by reference in its entirety.

BACKGROUND

1. Technical Field

Embodiments of the present disclosure relate to an integrated circuit technology and, more particularly, to a semiconductor device, a semiconductor system, and an operating method of the semiconductor device.

2. Related Art

A training operation for a semiconductor device needs to be completed in order for the semiconductor device to operate normally after being mounted on a semiconductor system.

The training operation may mean an operation of adjusting timing of signals after the start of bootup so that the signals can be transmitted and received normally between the semiconductor device and a controller.

Research for improving user satisfaction by reducing the time for the bootup operation of a semiconductor system is carried out.

SUMMARY

In an embodiment of the present disclosure, a semiconductor system may include a semiconductor device, a controller configured to control the semiconductor device through an in-band interface, and a baseboard management controller configured to control the semiconductor device through a side-band interface, wherein the semiconductor device is configured to control a training operation for in-band signals that are received through the in-band interface based on side-band signals that are received through the side-band interface.

In an embodiment of the present disclosure, a semiconductor device may include a reception circuit configured to receive in-band signals from a controller through an in-band interface, a transmission and reception circuit configured to transmit and receive side-band signals to and from a baseboard management controller through a side-band interface, a command decoding circuit configured to generate a training activation signal based on the output of the transmission and reception circuit, a sampling circuit configured to generate a sampling pattern by sampling the output of the reception circuit based on the training activation signal, a comparison circuit configured to generate at least one pattern comparison signal by comparing the sampling pattern with at least one preset pattern based on the training activation signal, and a mode register set configured to store the pattern comparison signal based on the training activation signal.

In an embodiment of the present disclosure, an operating method of a semiconductor device may include determining whether to perform a training operation based on side-band signals that are received through a side-band interface, generating a sampling pattern based on in-band signals that are received through an in-band interface when it is determined to perform the training operation, comparing the sampling pattern with a preset pattern, and storing the comparing result.

DETAILED DESCRIPTION

Hereinafter, embodiments according to the technical spirit of the present disclosure are described with reference to the accompanying drawings.

Embodiments of the present disclosure may provide a semiconductor device, a semiconductor system, and an operating method of the semiconductor device, for reducing the time for a bootup operation of the semiconductor system.

User satisfaction can be improved because the time for a bootup operation can be reduced.

Figure 1:
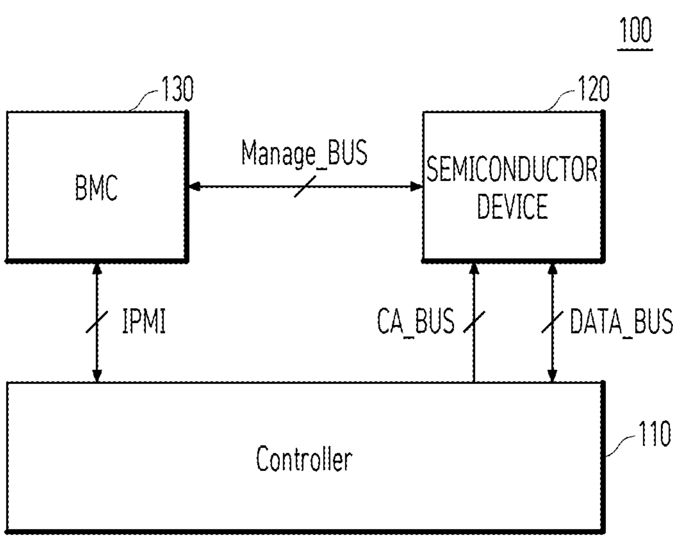
FIG. 1 is a diagram illustrating a construction of a semiconductor system according to an embodiment of the present disclosure.

FIG. 1 is a diagram illustrating a construction of a semiconductor system 100 according to an embodiment of the present disclosure.

Referring to FIG. 1, the semiconductor system 100 may include a controller 110, a semiconductor device 120, and a baseboard management controller (BMC) 130. In an embodiment, the semiconductor device 120 may be a memory device, for example, a dynamic random access memory (DRAM). In another embodiment, the semiconductor device 120 may be a memory module including a plurality of memory devices (e.g., a plurality of pieces of DRAM).

The controller 110 may control an operation of the semiconductor device 120. The controller 110 may be included within a processor, such as a central processing unit (CPU), a graphic processing unit (GPU), or an application processor (AP). The controller 110 may transmit a command and an address to the semiconductor device 120 through a command address bus CA_BUS, and may transmit and receive data to and from the semiconductor device 120 through a data bus DATA_BUS.

The semiconductor device 120 may perform a set operation under the control of the controller 110. For example, when the semiconductor device 120 is a memory device, the semiconductor device 120 may perform a read operation and a write operation under the control of the controller 110. The semiconductor device 120 may perform an operation that is indicated by the command and address that are transmitted through the command address bus CA_BUS, may transmit data to the controller 110 through the data bus DATA_BUS after the start of a read operation, and may receive data that are transmitted through the data bus DATA_BUS after the start of a write operation. That is, the semiconductor device 120 may distinguish between the read operation and the write operation based on the command and the address that are transmitted through the command address bus CA_BUS. Then, the semiconductor device 120 may transmit, to the controller 110, data that have been stored in the semiconductor device 120 through the data bus DATA_BUS after the start of the read operation, and may store data that have been received through the data bus DATA_BUS after the start of the write operation.

The BMC 130 may perform management and monitoring functions that are mounted on a basic board of a device, such as a server or a PC. The BMC 130 may communicate with the semiconductor device 120, and may manage circuits within the semiconductor device 120. Further, the BMC 130 may communicate with the controller 110, may check the state of the semiconductor system, and may manage the semiconductor system or diagnose a problem thereof. For example, when the semiconductor device 120 is a memory device that includes pieces of memory, the BMC 130 may manage pieces of memory within the semiconductor device 120. An interface called an intelligent platform management interface (IPMI) may be basically used for communication between the BMC 130 and the controller 110. Furthermore, communication between the BMC 130 and the semiconductor device 120 may be performed through a management bus Manage_BUS. A memory module management control (M3C) interface that is similar to an inter-integrated circuit (I2C) interface may be used as the management bus Manage_BUS.

The command address bus CA_BUS and the data bus DATA_BUS between the controller 110 and the semiconductor device 120 may each be a bus that is used to perform a main function of the semiconductor device 120. Accordingly, such an interface may be called an in-band interface. In this case, an external chip selection signal CS_e, an external clock CLK_e, and data DQ may be transmitted and received through the in-band interface. Specifically, the external chip selection signal CS_e and the external clock CLK_e may be transmitted and received through the command address bus CA_BUS. The data DQ may be transmitted and received through the data bus DATA_BUS. Furthermore, the management bus Manage_BUS between the BMC 130 and the semiconductor device 120 may be used for additional control or management of the semiconductor device 120. Accordingly, such an interface may be called a side-band interface. In this case, a management clock SCL and a management control signal SCA may be transmitted and received through the side-band interface, that is, the management bus Manage_BUS.

The semiconductor system 100 constructed as described above according to an embodiment of the present disclosure may perform the following bootup operation.

When a bootup operation is performed on the semiconductor system 100, the controller 110, the semiconductor device 120, and the BMC 130 may each perform a bootup operation according to a set sequence. For example, the controller 110, the semiconductor device 120, and the BMC 130 may each perform a training operation that is related to the transmission and reception of signals between the controller 110 and the semiconductor device 120. More specifically, for example, the controller 110 may provide the external chip selection signal CS_e and the external clock CLK_e to the semiconductor device 120 through the in-band interface. The semiconductor device 120 may perform a training operation on the pattern of the level of the external chip selection signal CS_e based on the external clock CLK_e under the control of the BMC 130, and may accumulate and store the results of the training. Furthermore, the BMC 130 may receive the results of the training that have been accumulated in the semiconductor device 120 through the management bus (i.e., Manage_BUS), and may transmit the results of the training to the controller 110 through the IPMI interface if there is a request from the controller 110 or if it is determined that the results of the training need to be transmitted to the controller 110. Accordingly, the time that is taken for the bootup operation of the semiconductor system 100 to be performed can be reduced because the training operation between the controller 110 and the semiconductor device 120 can be performed while the controller 110 performs the bootup operation according to the set sequence.

A construction and operation of the semiconductor device that is included in the semiconductor system that operates as described above according to an embodiment of the present disclosure may be described as follows with reference to FIGS. 2 to 4.

Figure 2:
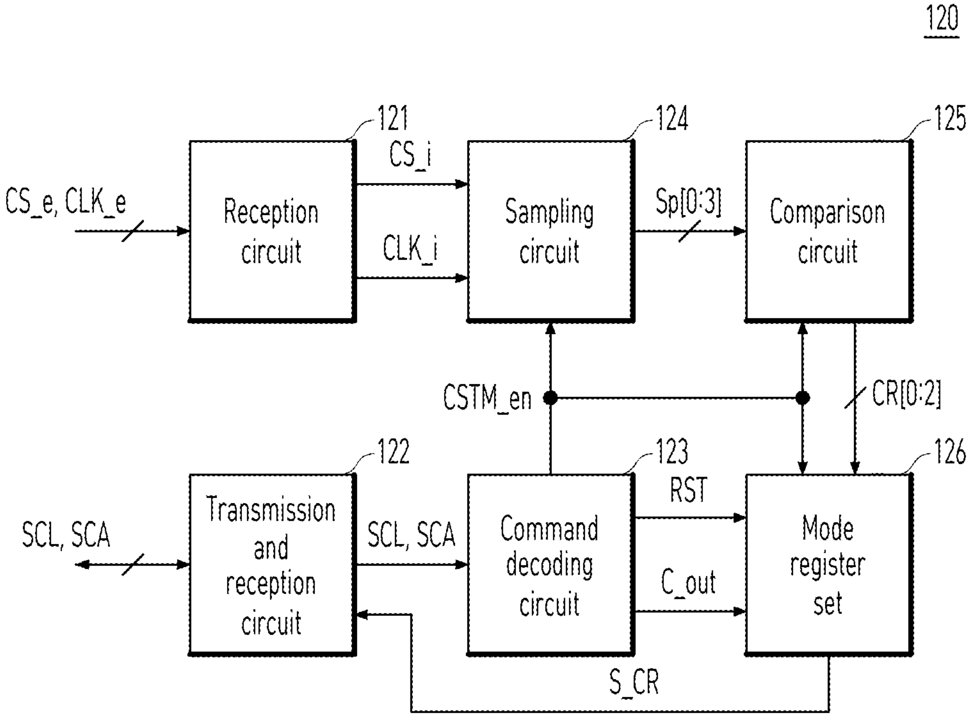
FIG. 2 is a diagram illustrating a construction of a semiconductor device according to an embodiment of the present disclosure.

FIG. 2 is a diagram illustrating the construction of the semiconductor device 120 according to an embodiment of the present disclosure.

Referring to FIG. 2, the semiconductor device 120 may include a reception circuit 121, a transmission and reception circuit 122, a command decoding circuit 123, a sampling circuit 124, a comparison circuit 125, and a mode register set 126.

The reception circuit 121 may receive, from the controller 110, the external chip selection signal CS_e and the external clock CLK_e through the in-band interface, and may output the external chip selection signal CS_e and the external clock CLK_e as an internal chip selection signal CS_i and an internal clock CLK_i, respectively. For example, the reception circuit 121 may receive, from the controller 110, the external chip selection signal CS_e and the external clock CLK_e, and may transmit, to the sampling circuit 124, the internal chip selection signal CS_i and the internal clock CLK_i.

The transmission and reception circuit 122 may transmit and receive a management clock SCL and a management control signal SCA to and from the BMC 130 through the side-band interface. For example, the transmission and reception circuit 122 may receive, from the BMC 130, the management clock SCL and the management control signal SCA through the side-band interface, may transmit the management clock SCL and the management control signal SCA to the command decoding circuit 123, and may transmit, to the BMC 130, a training result S_CR received from the mode register set 126 through the side-band interface.

The command decoding circuit 123 may generate a training activation signal CSTM_en, a reset signal RST, and a result output signal C_out, based on the management clock SCL and management control signal SCA of the BMC 130, which are transmitted by the transmission and reception circuit 122. For example, the command decoding circuit 123 may generate at least one of the training activation signal CSTM_en, the reset signal RST, and the result output signal C_out by decoding the management control signal SCA based on the management clock SCL of the BMC 130, which is transmitted by the transmission and reception circuit 122. That is, the command decoding circuit 123 may enable at least one of the training activation signal CSTM_en, the reset signal RST, and the result output signal C_out by decoding the management control signal SCA.

The sampling circuit 124 may be activated when the training activation signal CSTM_en is enabled, and may be deactivated when the training activation signal CSTM_en is disabled. The sampling circuit 124 that has been activated may generate a sampling pattern Sp[0:3] by receiving, from the reception circuit 121, the internal chip selection signal CS_i and the internal clock CLK_i. For example, the sampling circuit 124 may generate the sampling pattern Sp[0:3] by sampling the level of the internal chip selection signal CS_i at a specific edge of the internal clock CLK_i, and may output the generated sampling pattern Sp[0:3] to the comparison circuit 125.

The comparison circuit 125 may be activated when the training activation signal CSTM_en is enabled, and may be deactivated when the training activation signal CSTM_en is disabled. The comparison circuit 125 that has been activated may generate a plurality of comparison result signals CR[0:2] based on the sampling pattern Sp[0:3] that is received from the sampling circuit 124. For example, the comparison circuit 125 may generate the plurality of comparison result signals CR[0:2] by comparing the sampling pattern Sp[0:3] and each of a plurality of preset patterns. More specifically, for example, the comparison circuit 125 may enable one of first to third comparison result signals CR[0:2] by comparing the sampling pattern Sp[0:3] and each of first and second preset patterns. When the sampling pattern Sp[0:3] and the first preset pattern are the same, the comparison circuit 125 may enable the first comparison result signal CR[0]. When the sampling pattern Sp[0:3] and the second preset pattern are the same, the comparison circuit 125 may enable the second comparison result signal CR[1]. When the sampling pattern Sp[0:3] and the first and second preset patterns are not all the same, the comparison circuit 125 may enable the third comparison result signal CR[2].

The mode register set 126 may be activated when the training activation signal CSTM_en is enabled, and may be deactivated when the training activation signal CSTM_en is disabled. The mode register set 126 that has been activated may store the plurality of comparison result signals CR [0:2] that are output by the comparison circuit 125. Furthermore, the mode register set 126 that has been activated may initialize information of the plurality of comparison result signals CR [0:2] that have been stored by the reset signal RST that has been output by the command decoding circuit 123. Furthermore, the mode register set 126 that has been activated may output, to the transmission and reception circuit 122, information of the plurality of comparison result signals CR[0:2] as the training result S_CR, which have been stored by the result output signal C_out that has been output by the command decoding circuit 123.

Figure 3:
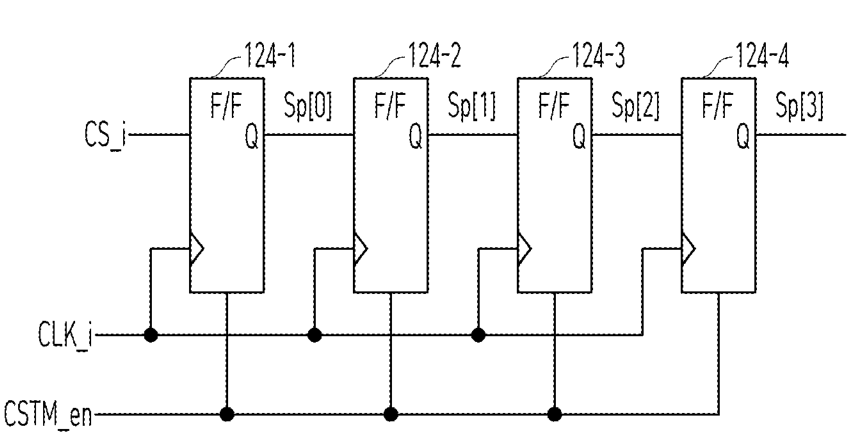
FIG. 3 is a diagram illustrating a construction of a sampling circuit of the semiconductor device according to an embodiment of the present disclosure.

FIG. 3 is a diagram illustrating a construction of the sampling circuit of the semiconductor device according to an embodiment of the present disclosure.

Referring to FIG. 3, the sampling circuit 124 may include a plurality of flip-flops (F/F) 124-1, 124-2, 124-3, and 124-4. In an embodiment, FIG. 3 illustrates that the sampling pattern Sp[0:3] includes first to fourth sampling signals Sp[0], Sp[1], Sp[2], and Sp[3] and the plurality of flip-flops 124-1, 124-2, 124-3, and 124-4 includes first to fourth flip-flops 124-1, 124-2, 124-3, and 124-4. It is to be noted that in FIG. 3, the number of first to fourth sampling signals Sp[0], Sp[1], Sp[2], and Sp[3] that are included in the sampling pattern Sp[0:3] and the number of flip-flops 124-1, 124-2, 124-3, and 124-4 that are included in the sampling circuit 124*d* are not limited and are described as an example.

The sampling circuit 124 may include the first to fourth flip-flops 124-1, 124-2, 124-3, and 124-4. The first to fourth flip-flops 124-1, 124-2, 124-3, and 124-4 may each be activated when the training activation signal CSTM_en is enabled, and may be deactivated when the training activation signal CSTM_en is disabled. The first flip-flop 124-1 may be provided with the internal chip selection signal CS_i and the internal clock CLK_i. The first flip-flop 124-1 may latch the internal chip selection signal CS_i at a specific edge (e.g., a rising edge) of the internal clock CLK_i, and may output the latched internal chip selection signal as the first sampling signal Sp[0]. The second flip-flop 124-2 may be provided with the first sampling signal Sp[0] and the internal clock CLK_i. The second flip-flop 124-2 may latch the first sampling signal Sp[0] at a specific edge (e.g., a rising edge) of the internal clock CLK_i, and may output the latched sampling signal as the second sampling signal Sp[1]. The third flip-flop 124-3 may be provided with the second sampling signal Sp[1] and the internal clock CLK_i. The third flip-flop 124-3 may latch the second sampling signal Sp[1] at a specific edge (e.g., a rising edge) of the internal clock CLK_i, and may output the latched sampling signal as the third sampling signal Sp[2]. The fourth flip-flop 124-4 may be provided with the third sampling signal Sp[2] and the internal clock CLK_i. The fourth flip-flop 124-4 may latch the third sampling signal Sp[2] at a specific edge (e.g., a rising edge) of the internal clock CLK_i, and may output the latched sampling signal as the fourth sampling signal Sp[3].

The sampling circuit 124 constructed as described above may generate the first to fourth sampling signals Sp[0], Sp[1], Sp[2], and Sp[3] by latching the internal chip selection signal CS_i whenever the internal clock CLK_i transits at a specific edge (e.g., a rising edge) four times during four cycles of the internal clock CLK_i. In this case, the first to fourth sampling signals Sp[0], Sp[1], Sp[2], and Sp[3] that have been generated may be output as the sampling pattern Sp[0:3].

Figure 4:
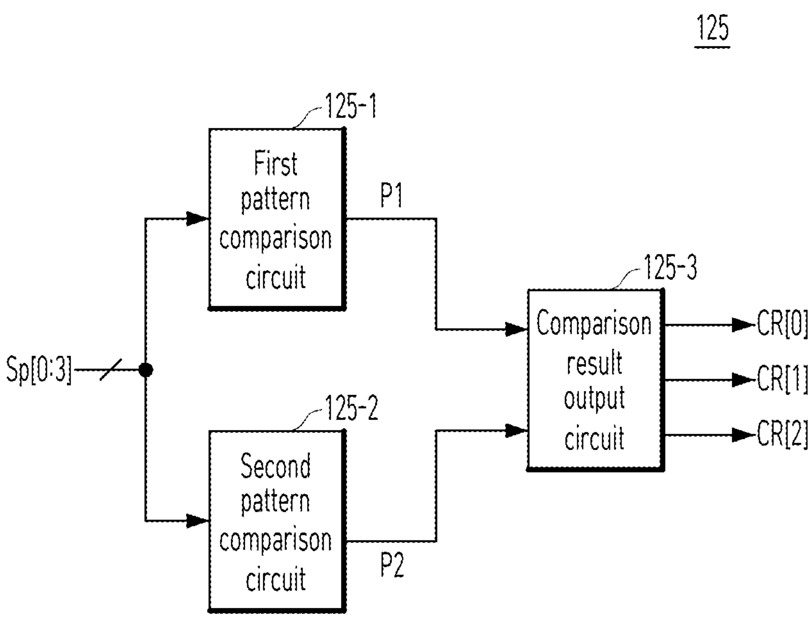
FIG. 4 is a diagram illustrating a construction of a comparison circuit of the semiconductor device according to an embodiment of the present disclosure.

FIG. 4 is a diagram illustrating a construction of the comparison circuit 125 of the semiconductor device 120 according to an embodiment of the present disclosure.

Referring to FIG. 4, the comparison circuit 125 may include a first pattern comparison circuit 125-1, a second pattern comparison circuit 125-2, and a comparison result output circuit 125-3. It is to be noted that in FIG. 4, the comparison circuit 125 has been merely illustrated by taking two preset patterns as an example and the number of preset patterns is not limited.

The first pattern comparison circuit 125-1 may generate a first pattern comparison signal P1 by comparing the sampling pattern Sp[0:3] with the first preset pattern. For example, when the sampling pattern Sp[0:3] is the same as the first preset pattern, the first pattern comparison circuit 125-1 may enable the first pattern comparison signal P1. When the sampling pattern Sp[0:3] is different from the first preset pattern, the first pattern comparison circuit 125-1 may disable the first pattern comparison signal P1.

The second pattern comparison circuit 125-2 may generate a second pattern comparison signal P2 by comparing the sampling pattern Sp[0:3] with the second preset pattern. For example, when the sampling pattern Sp[0:3] is the same as the second preset pattern, the second pattern comparison circuit 125-2 may enable the second pattern comparison signal P2. When the sampling pattern Sp[0:3] is different from the second preset pattern, the second pattern comparison circuit 125-2 may disable the second pattern comparison signal P2. In this case, the first preset pattern and the second preset pattern may be different patterns. Furthermore, the first and second pattern comparison circuits 125-1 and 125-2 may each include a decoding circuit.

The comparison result output circuit 125-3 may generate the first to third comparison result signals CR[0], CR[1], and CR[2] based on the first and second pattern comparison signals P1 and P2. For example, the comparison result output circuit 125-3 may enable one of the first to third comparison result signals CR[0], CR[1], and CR[2] based on the first and second pattern comparison signals P1 and P2. More specifically, for example, when the first pattern comparison signal P1, among the first and second pattern comparison signals P1 and P2, is enabled, the comparison result output circuit 125-3 may enable the first comparison result signal CR[0]. When the second pattern comparison signal P2, among the first and second pattern comparison signals P1 and P2, is enabled, the comparison result output circuit 125-3 may enable the second comparison result signal CR[1]. When the first and second pattern comparison signals P1 and P2 are all disabled, the comparison result output circuit 125-3 may enable the third comparison result signal CR[2].

An operation of the semiconductor device constructed as described above according to an embodiment of the present disclosure may be described as follows with reference to FIG. 5.

Figure 5:
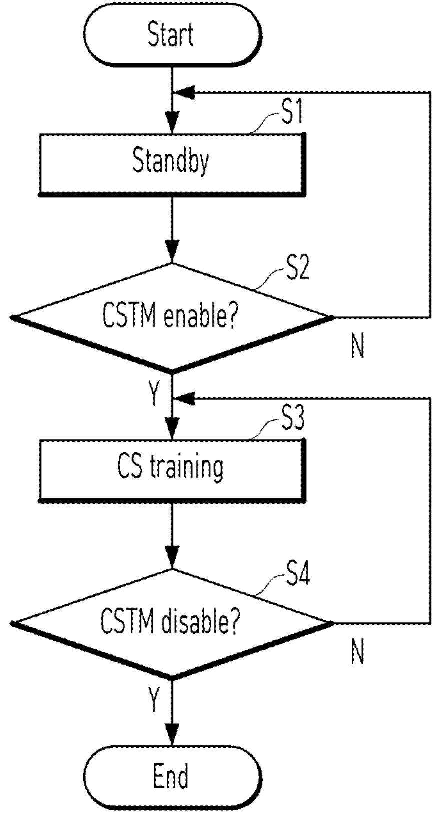
FIG. 5 is a flowchart illustrating an operation of the semiconductor device according to an embodiment of the present disclosure.

FIG. 5 is a flowchart illustrating an operation of the semiconductor device according to an embodiment of the present disclosure.

Referring to FIG. 5, an operating method of the semiconductor device according to an embodiment of the present disclosure may include a standby operation S1, a training activation check operation S2, a training execution operation S3, and a training deactivation check operation S4.

The standby operation S1 may be a standby operation of a training operation. In this operation, the semiconductor system has been booted up, but a training operation has not been performed. In the standby operation S1, a command for the execution of a training operation has not been received by the semiconductor device 120 through the side-band interface. The standby operation S1 may include an interval in which the sampling circuit 124, the comparison circuit 125, and the mode register set 126 are deactivated. In this case, in the standby operation S1, the reception circuit 121 and the transmission and reception circuit 122 may be activated.

The training activation check operation S2 may include an operation of determining that the semiconductor device 120 has received, from the BMC 130, a command that instructs to perform a training operation, through the side-band interface. For example, the semiconductor device 120 has received, from BMC 130, a request that instructs to perform a chip selection training mode (CSTM), then the chip selection training mode enables and the training activation check operation S2 is performed. The request may be the command that instructs to perform the chip selection training mode (CSTM). Wherein the request or the command may be a management control signal (SCA).

When it is determined that the semiconductor device 120 has received, from the BMC 130, the command that instructs to perform the training operation (S2, Y), the training execution operation S3 may be performed. The training execution operation S3 may include a chip selection training (CS training) operation. When it is not determined that the semiconductor device 120 has received the command that instructs to perform the training operation from the BMC 130 (S2, N), the standby operation S1 may be maintained. That is, the standby operation S1 and the training activation check operation S2 may be repeatedly performed until the semiconductor device 120 receives the command that instructs performing the training operation.

The training execution operation S3 may include performing, by the semiconductor device 120, the training operation as the semiconductor device 120 receives, from the BMC 130, the command that instructs performing the training operation. For example, the training execution operation S3 may include enabling the training activation signal CSTM_en based on the command of the BMC 130, which is received through the side-band interface, and activating the sampling circuit 124, the comparison circuit 125, and the mode register set 126 based on the enabled training activation signal CSTM_en. In this case, the sampling circuit 124 that has been activated may generate the sampling pattern Sp[0:3] based on the internal chip selection signal CS_i and the internal clock signal CLK_i that are provided by the reception circuit 121 through the in-band interface. That is, the sampling circuit 124 that has been activated may generate the sampling pattern Sp[0:3] by latching the internal chip selection signal CS_i that is received through the in-band interface at a specific edge of the internal clock CLK_i. The comparison circuit 125 that has been activated may compare the sampling pattern Sp[0:3] with each of preset patterns, and may output, as the comparison result signals CR[0:2], information indicating whether the sampling pattern Sp[0:3] and each of the preset patterns are the same. The mode register set 126 that has been activated may store the comparison result signals CR[0:2]. That is, the training execution operation S3 may include generating the sampling pattern Sp[0:3] by using the internal chip selection signal CS_i and the internal clock CLK_i that have been received through the in-band interface, comparing the generated sampling pattern Sp[0:3] with each of the preset patterns, and storing the results of the comparison. Furthermore, the training execution operation S3 may additionally include initializing data that have been stored in the mode register set 126 based on a command of the BMC 130, which is received through the side-band interface, and outputting the results of the comparison, which have been stored in the mode register set 126. At this time, when the command of the BMC 130, which has been received through the side-band interface, is decoded by the command decoding circuit 123 and thus the reset signal RST is enabled, the mode register set 126 may be initialized. Furthermore, when the command of the BMC 130, which has been received through the side-band interface, is decoded by the command decoding circuit 123 and thus the result output signal C_out is enabled, the results of the comparison, which have been stored in the mode register set 126, may be transmitted to the transmission and reception circuit 122 as the training result S_CR. The transmission and reception circuit 122 may transmit the received training result S_CR to the BMC 130 through the side-band interface.

The training deactivation check operation S4 may include determining that a command (or a request) of the BMC 130, which instructs terminating the training operation, has been received through the side-band interface. For example, the semiconductor device 120 has received, from BMC 130, a request that instructs terminating a chip selection training mode (CSTM), then the chip selection training mode (CSTM) disables and the training deactivation check operation S4 is performed. The request may be the command that instructs terminating the chip selection training mode (CSTM). Wherein the request or the command may be a management control signal (SCA). In this case, the training deactivation check operation S4 may include deactivating the training activation signal CSTM_en when the command decoding circuit 123 identifies that the command of the BMC 130, which has been received through the side-band interface, is the command that instructs terminating the training operation. At this time, when the training activation signal CSTM_en is deactivated, the sampling circuit 124, the comparison circuit 125, and the mode register set 126 may be deactivated. When the command that instructs terminating the training operation is determined (S4, Y), the training operation of the semiconductor device according to an embodiment of the present disclosure may be terminated. When the command that instructs terminating the training operation is not determined (S4, N), the training execution operation S3 may be maintained.

As described above, the training method of the semiconductor device according to an embodiment of the present disclosure may be a method of controlling a training operation for signals that are received through the in-band interface based on signals that are received through the side-band interface. Furthermore, the semiconductor system according to an embodiment of the present disclosure can reduce the time that is taken for a bootup operation of the semiconductor system 110 in a way that the BMC 130 controls a training operation of the semiconductor device 120, during a bootup operation of the controller 110, through the side-band interface.

Although embodiments according to the technical spirit of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains may substitute, modify, and change the embodiments in various ways without departing from the technical spirit of the present disclosure written in the claims. Such substitutions, modifications, and changes may be said to belong to the scope of the present disclosure. Furthermore, the embodiments may be combined to form additional embodiments.

What is claimed is:

1. A semiconductor system comprising:

a semiconductor device;

a controller configured to control the semiconductor device through an in-band interface; and a baseboard management controller configured to control the semiconductor device through a side-band interface, wherein the semiconductor device is configured to control a training operation for in-band signals that are received through the in-band interface based on side-band signals that are received through the side-band interface, wherein the in-band signals comprise an external chip selection signal and an external clock, and wherein the training operation includes performing the training operation based on the external chip selection signal and the external clock.

2. The semiconductor system of claim 1, wherein the semiconductor device controls whether to perform the training operation based on the side-band signals.

3. The semiconductor system of claim 2, wherein the semiconductor device generates an internal chip selection signal and an internal clock by receiving the external chip selection signal and the external clock, generates a sampling pattern by latching the internal chip selection signal at a specific edge of the internal clock when the training operation is performed based on the side-band signals, and stores one or more comparison results by comparing the sampling pattern with at least one preset pattern.

4. The semiconductor system of claim 3, wherein the semiconductor device transmits, to the baseboard management controller, the stored comparison results based on the side-band signals, through the side-band interface.

5. A semiconductor device comprising:

a reception circuit configured to receive in-band signals from a controller through an in-band interface;

a transmission and reception circuit configured to transmit and receive side-band signals to and from a baseboard management controller through a side-band interface;

a command decoding circuit configured to generate a training activation signal based on an output of the transmission and reception circuit;

a sampling circuit configured to generate a sampling pattern by sampling an output of the reception circuit based on the training activation signal;

a comparison circuit configured to generate at least one pattern comparison signal by comparing the sampling pattern with at least one preset pattern based on the training activation signal; and a mode register set configured to store the pattern comparison signal based on the training activation signal, wherein the at least one pattern comparison signal stored in the mode register set is output to the baseboard management controller through the side-band interface.

6. The semiconductor device of claim 5, wherein:

the in-band signals comprise an external chip selection signal and an external clock, and the reception circuit generates an internal chip selection signal and an internal clock by receiving the external chip selection signal and the external clock.

7. The semiconductor device of claim 6, wherein the sampling circuit generates the sampling pattern by latching the internal chip selection signal at a specific edge of the internal clock when the training activation signal is enabled.

8. The semiconductor device of claim 5, wherein the comparison circuit compares the sampling pattern with the preset pattern to determine whether the sampling pattern and the preset pattern are identical with each other when the training activation signal is enabled, and generates one or more results of the comparison as the at least one pattern comparison signal.

9. The semiconductor device of claim 5, wherein the command decoding circuit further generates a reset signal and a result output signal based on the output of the transmission and reception circuit.

10. The semiconductor device of claim 9, wherein the mode register set initializes information of the at least one pattern comparison signal that has been stored when the reset signal is enabled, and transmits, to the baseboard management controller, the information of the at least one pattern comparison signal that has been stored, through the side-band interface by transmitting, to the transmission and reception circuit, the information of the at least one pattern comparison signal that has been stored when the result output signal is enabled.

11. An operating method of a semiconductor device, the operating method comprising:

determining whether to perform a training operation based on side-band signals that are received through a side-band interface;

generating a sampling pattern based on in-band signals that are received through an in-band interface when it is determined to perform the training operation;

comparing the sampling pattern generated during the training operation with a preset pattern to generate a comparing result;

storing the comparing result; and outputting the stored comparing result through the side-band interface.

12. The operating method of claim 11, wherein:

the in-band signals comprise a chip selection signal and a clock, and the generating of the sampling pattern comprises generating the sampling pattern by latching the chip selection signal at a specific edge of the clock.

13. The operating method of claim 11, wherein the comparing of the sampling pattern with the preset pattern comprises comparing the sampling pattern with the preset pattern to determine whether the sampling pattern and the preset pattern are identical with each other.

14. The operating method of claim 11, further comprising initializing the stored comparing result, based on the side-band signals.

15. The operating method of claim 11, further comprising outputting the stored comparing result through the side-band interface based on the side-band signals.

16. The operating method of claim 11, wherein:

the side-band interface couples between the semiconductor device and a baseboard management controller.

17. The operating method of claim 16, wherein:

the in-band interface couples between the semiconductor device and a controller.

18. The semiconductor system of claim 3, wherein the semiconductor device further includes a mode resister set configured to store results of the training operation, wherein the training results stored in the mode resister set are output to the baseboard management controller through the side-band interface.

* * * * *